United States Patent
Haluska

[11] Patent Number: 5,318,857
[45] Date of Patent: Jun. 7, 1994

[54] LOW TEMPERATURE OZONOLYSIS OF SILICON AND CERAMIC OXIDE PRECURSOR POLYMERS TO CERAMIC COATINGS

[75] Inventor: Loren A. Haluska, Midland, Mich.

[73] Assignee: Dow Corning Corporation, Midland, Mich.

[21] Appl. No.: 432,119

[22] Filed: Nov. 6, 1989

[51] Int. Cl.$^5$ ............................ B22F 7/00; B05D 1/00
[52] U.S. Cl. .................................. 428/552; 427/126.3; 427/126.4; 427/397.7
[58] Field of Search .................. 427/39, 38, 41, 126.4, 427/255.7, 126.3, 397.7; 428/552; 458/546

[56] References Cited

U.S. PATENT DOCUMENTS

| | | | |
|---|---|---|---|
| 4,527,007 | 7/1985 | Fuse | 136/256 |
| 4,587,171 | 5/1986 | Hamano et al. | 428/448 |
| 4,749,631 | 6/1988 | Haluska et al. | 428/704 |
| 4,753,856 | 6/1988 | Haluska et al. | 428/698 |
| 4,894,254 | 1/1990 | Nakayama et al. | 427/38 |

FOREIGN PATENT DOCUMENTS 289939 11/1988 Japan .

OTHER PUBLICATIONS

CA 88: 109402a.
CA 105: 124818.

Primary Examiner—Peter A. Nelson
Attorney, Agent, or Firm—Roger E. Gobrogge

[57] ABSTRACT

The present invention relates to a rapid, low-temperature method of forming a ceramic or ceramic-like coating on a substrate. It comprises coating the substrate with a solution comprising a solvent and one or more hydrolyzed or partially hydrolyzed preceramic silicon alkoxides and, optionally, a ceramic oxide precursor. The solvent is evaporated and a preceramic coating thereby deposited on the substrate. The coated substrate is heated to a temperature of between about 40° to about 400° C. in the presence of ozone to ceramify the ceramic or ceramic-like coating. Additional protective coatings may be applied onto the coating thus produced.

37 Claims, No Drawings

# LOW TEMPERATURE OZONOLYSIS OF SILICON AND CERAMIC OXIDE PRECURSOR POLYMERS TO CERAMIC COATINGS

FIELD OF INVENTION

This invention relates to the protection of substrates such as electronic devices with surface-applied ceramic coatings of materials such as amorphous silica, silicon, silicon carbide, silicon nitride and silicon carbonitride.

BACKGROUND OF THE INVENTION

Electronic devices, to be serviceable under a wide variety of environmental conditions, must be able to withstand moisture, heat and abrasion, among other stresses. A significant amount of work has been reported directed toward various protective measures to minimize the exposure of these devices to the above conditions and thereby increase their reliability and life. Most of these measures, however, suffer from various drawbacks.

For instance, early measures involved potting electronics within a polymeric resin and, thereby, reducing environmental exposure, These methods proved to be of limited value, however, since most resins are not impermeable to environmental moisture and they generally add extra size and weight.

A second method of protection involves sealing the device within a ceramic package. This process has proven to be relatively effective in increasing device reliability and is currently used in select applications. The added size, weight and cost involved in this method, however, inhibits widespread application in the electronic industry.

Recently, the use of lightweight ceramic coatings has been suggested. For instance, Haluska et al. in U.S. Pat. Nos. 4,749,631 and 4,753,856, which are incorporated herein in their entirety by reference, disclose silicon containing coatings produced by applying solutions of silicon alkoxides or silicon alkoxides and metal oxide precursors, respectively, to an electronic device and then ceramifying by heating to temperatures of 200°-1000° C. These references also describe the application of other coatings containing silicon carbide, silicon nitride or silicon carbonitride onto the initial silica layer for added protection. The ceramic coatings produced thereby have many desirable characteristics such as microhardness, moisture resistance, ion barrier, adhesion, ductility, tensile strength and thermal expansion coefficient matching which provide excellent protection to the underlying substrate.

Despite the efficacy of the above coatings, ceramification at temperatures less than 400° C. is so slow that commercial application is impractical. Moreover, ceramification at temperatures in excess of 400° C. often results in the destruction of many temperature sensitive devices. Therefore, a need exists for a method of rapidly applying ceramic coatings from silicon alkoxides at low temperature.

Chemical vapor deposition of $SiO_2$ films from silicon alkoxides and ozone is well known. (See, for example CA 88:109402a and CA 105:124,818) These references, however, do not describe the solution coating method claimed herein.

The use of ozone as a method for low temperature conversion of hydrogen silsesquioxane preceramic solution to a ceramic coating has recently been disclosed by Haluska et al. in co-pending application Ser. No. 07/312,457, which is incorporated herein in its entirety by reference. This application, however, does not disclose the use of ozone with silicon alkoxides.

The present inventor has discovered that a ceramic coating derived from a preceramic solution of silicon alkoxides and, optionally, ceramic oxide precursors can be rapidly applied to various substrates at temperatures as low as 40° C. when the ceramification is conducted in an ozone environment.

SUMMARY OF THE INVENTION

The present invention relates to a rapid, low-temperature method of forming a ceramic or ceramic-like coating on a substrate. It comprises coating the substrate with a solution comprising a solvent and one or more hydrolyzed or partially hydrolyzed preceramic silicon alkoxides of the formula $R_xSi(OR)_{4-x}$ and, optionally, ceramic oxide precursors, wherein R is an alkyl of 1-20 carbon atoms, an aryl, an alkenyl or an alkynyl and x is 0-2. The solvent is evaporated and a preceramic coating thereby deposited on the substrate. The coated substrate is then heated to a temperature of between about 40° to about 400° C. in the presence of ozone to ceramify the preceramic coating.

The process of the invention is useful for forming protective coatings on any temperature sensitive material. In particular, however, the process is advantageous for sealing electronic devices from various environmental stresses such as moisture, heat and abrasion. Furthermore, silicon alkoxides having the above formula have been found to be particularly useful for applying coatings on indium tin oxide substrates.

The present invention also relates to the formation of additional ceramic or ceramic-like coatings on the coating formed above. In a dual layer system, the second passivation layer may comprise silicon containing coatings, silicon carbon-containing coatings, silicon nitrogen-containing coatings, silicon carbon nitrogen containing coatings or an additional silicon dioxide and ceramic oxide coating. In a triple layer system, the second passivation layer may comprise silicon carbon-containing coatings, silicon nitrogen-containing coatings, silicon carbon nitrogen containing coatings or an additional silicon dioxide and ceramic oxide coating and the third barrier coating may comprise silicon coatings, silicon carbon-containing coatings, silicon nitrogen-containing coatings, and silicon carbon nitrogen containing coatings.

The additional coating layers described above may be deposited using a number of techniques including, but not limited to, chemical vapor deposition, plasma enhanced chemical vapor deposition, metal assisted chemical vapor deposition or ceramification of a preceramic polymer.

DETAILED DESCRIPTION OF THE INVENTION

The present invention is based on the discovery that conversion of silicon alkoxides and, optionally, ceramic oxide precursors to ceramic or ceramic-like coatings may occur quickly at low temperatures by ceramification in the presence of ozone. The invention also relates to the process of coating the above ceramic or ceramic-like coating with additional passivating and/or barrier coatings comprising silicon, silicon carbide, silicon nitride, silicon carbonitride or silicon dioxide/ceramic oxide coatings as formed above.

The single and multilayer coatings taught herein are particularly useful in providing protective coatings on numerous temperature sensitive substrates such as electronic devices, electronic circuits or plastics including, for example, polyimides, epoxides, polytetrafluoroethylene and copolymers thereof, polycarbonates, acrylics and polyesters. The silicon alkoxides of the invention have also proven to be specifically useful for applying coatings on indium tin oxide substrates. The choice of substrates and devices to be coated by the instant invention, however, is limited only by the need for thermal and chemical stability of the substrate at the temperature and atmosphere utilized in the present invention. The coatings taught herein may also serve as dielectric layers, doped dielectric layers to produce transistor like devices, pigment loaded binder systems containing silicon to produce capacitor and capacitor like devices, multilayer devices, 3-D devices, silicon on insulator devices, super lattice devices and the like.

As used in the present invention, the expression "ceramic-like" refers to those pyrolyzed materials which are not fully free of residual carbon and/or hydrogen but which are otherwise ceramic in character; the expression "planarizing coating" refers to a coating which provides a surface barrier layer that is less irregular than the surface prior to application of the coating; the expressions "electronic device" or "electronic circuit" include, but are not limited to silicon based devices, gallium arsenide based devices, focal plane arrays, opto-electronic devices, photovoltaic cells and optical devices; and the expression "hydrolyzed or partially hydrolyzed" is used to designate a silicon alkoxide or mixture of silicon alkoxides which have been treated with aqueous, basic or acidic conditions so as to hydrolyze either all or a portion of the hydrolyzable substituents on the silicon alkoxide.

In the present invention, the ceramic or ceramic-like coating on the substrate may be formed by a process which comprises coating the substrate with a solution comprising a solvent and one or more hydrolyzed or partially hydrolyzed preceramic silicon alkoxides. The solvent is evaporated leaving a preceramic coating deposited on the substrate. The coated substrate is then heated to a temperature of between about 40° to about 400° C. in the presence of ozone to form the ceramic or ceramic-like coating.

Optionally, the ceramic or ceramic-like coating may be formed by a process which comprises coating the substrate with a solution comprising a solvent and a preceramic mixture of one or more hydrolyzed or partially hydrolyzed silicon alkoxides and a ceramic oxide precursor. The solvent is evaporated leaving a preceramic coating deposited on the substrate. The coated substrate is then heated to a temperature of between about 40° to about 400° C. in the presence of ozone to form the ceramic or ceramic-like coating.

The silicon alkoxides which are useful in the invention include one or more compounds of the formula $R_xSi(OR)_{4-x}$, wherein R is an alkyl of 1-20 carbon atoms such as methyl, ethyl, propyl etc., an aryl such as phenyl, an alkenyl such as vinyl or allyl or an alkynyl such as an ethynyl and x is 0-2. When hydrolyzed and condensed, these compounds are converted to primarily $SiO_2$ containing materials. Examples of specific compounds included herein include, but are not limited to, monomethyltriethoxysilane, monophenyltriethoxysilane, diethyldiethoxysilane, monovinyltrimethoxysilane, tetramethoxysilane, tetraethoxysilane, tetrapropoxysilane, and tetrabutoxysilane.

When the above compounds wherein x=2 are hydrolyzed and condensed, cyclic structures are usually generated. Since cyclics are generally not effective in film formation, they are usually not used as the sole preceramic compound. These compounds may, however, be cohydrolyzed with other preceramic compounds to form useful coating agents.

Additional preceramic materials which are expected to function equivalently include condensed esters of the formula $(RO)_3SiOSi(OR)_3$, disilanes of the formula $(RO)_xR_ySiSiR_y(OR)_x$, compounds containing structural units such as SiOC wherein the carbon containing group is hydrolyzable under the thermal conditions, or any other source of SiOR.

The above silicon alkoxides are particularly advantageous in that they do not have the reducing action that SiH containing $SiO_2$ precursors possess. As such, these compounds are useful in applying coatings on substrates, such as indium tin oxide, which may be affected by reduction.

If ceramic oxide precursors are to be included in the invention, they may be, for example, compositions of various metals such as zirconium, titanium, aluminum, tantalum, niobium and/or vanadium as well as various non-metallic compositions such as those of boron or phosphorous. The expression "ceramic oxide precursor", therefore, is meant to include such metal and non-metal compositions having one or more hydrolyzable groups bonded to the above metal or non-metal. Examples of hydrolyzable groups include, but are not limited to alkoxy, such as methoxy, ethoxy, propoxy etc, acyloxy, such as acetoxy, or other organic groups bonded to said metal or non-metal through an oxygen. These compositions must be capable of being hydrolyzed, and subsequently pyrolyzed, at low temperatures and relatively rapid reaction rates in the presence of ozone to ceramic oxide coatings. The ceramic oxide precursor is generally present in an amount such that the final ceramic coating contains 0.1 to 30% ceramic oxide.

In the case of highly reactive ceramic oxide precursors such as propoxides, isopropoxides, butoxides, isobutoxides or acetylacetonates, the ceramic oxide precursors and silicon alkoxides can be premixed and heated to reflux in ethanol for 24 hours to afford a homogenous reaction mixture which can be hydrolyzed uniformly and at a controlled rate. The refluxing produces a condensation reaction, the product of which can be hydrolyzed uniformly. However, attempts to pre-hydrolyze a mixture of the above mentioned highly reactive ceramic oxide precursors and a silicon elkoxide without the condensation reaction results in preferential and rapid hydrolysis of the ceramic oxide precursor over that of the silicon alkoxide, resulting in rapid, nonhomogenous gelation of the reaction mixture.

The solvent to be utilized in the instant invention can be any agent or mixture of agents which will dissolve the siliconalkoxide and ceramic oxide precursor, if present, without altering the ceramic coating produced thereby- These solvents can include, for example, alcohols such as ethyl or isopropyl, aromatic hydrocarbons such as benzene or toluene, alkanes such as n-heptane or dodecane, ketones, esters or glycol ethers, in an amount sufficient to dissolve the above materials to low solids. For instance, enough of the above solvent can be included to form a 0.1-35 weight % solution.

The preceramic solution of silicon alkoxides and, optionally, ceramic oxide precursors is coated onto the substrate. The method of coating can be, but is not limited to, spin coating, dip coating, spray coating or flow coating.

The solvent in the solution is allowed to evaporate and a preceramic coating thereby deposited. Any suitable means of evaporation may be utilized such as simple air drying or the application of a vacuum or mild heat. It is to be noted that when spin coating is utilized, an additional drying period is generally not necessary as the spinning tends to drive off the solvent.

The coating is ceramified by heating the coated substrate to a temperature of between about 40° to about 400° C. in the presence of ozone. Higher temperatures may be utilized in this process but doing so obviates the need for the use of ozone.

Any method of heating such as the use of a convection oven or radiant or microwave energy is generally functional herein. The rate of heating, moreover, is also not critical, but it is most practical and preferred to heat the substrate as rapidly as possible.

In a typical ceramification procedure, the coated substrate may be placed in a convection oven and a continuous flow of ozone introduced. The temperature in the oven i s then raised to the desired level (such as about 200° C.) and maintained for the desired time (such as about 0.5–8 hours).

The concentration of ozone to be included in this invention is any quantity sufficient to enhance ceramification. Generally, concentrations greater than 0.01 weight percent are effective with larger quantities producing better results.

The ozone used above may be generated by any practical means such as simply exposing oxygen to a source of ultraviolet light. The UV light may come from any source capable of emitting a wavelength in the range of from about 185 to about 200 nm such as, for example, a quartz-mercury lamp. The oxygen source may simply be an ambient atmosphere, but it has been found that enriched oxygen atmospheres or atmospheres of pure oxygen aid in increasing the rate of ceramification.

Alternatively, the ozone may be generated by passing an oxygen source through an ozone generator. Various generators are well known in the art and many are commercially available. The process using an ozone generator is particularly advantageous since a much greater quantity of ozone may be produced. For instance, an ozone generator may produce ozone concentrations up to about 10 weight percent whereas the UV light method is only effective in producing concentrations up to about 0.1 weight percent.

The mechanism whereby ozone decreases the temperature necessary for ceramification has not been fully elucidated but it is believed that ozone enhances the oxidation of the silicon alkoxide and ceramic oxide precursor, if present, to form the ceramic or ceramic-like coating.

In addition to ozone, water vapor may also be included in the pyrolysis procedure. This inclusion has been shown to further enhance the rate of ozone oxidation.

By the above methods a thin (less than 2 microns) ceramic or ceramic like planarizing coating is produced on the substrate. The coating smooths the irregular surfaces of various substrates and has excellent adhesive properties. In addition, the coating may be covered by other coatings such as further $SiO_2$/ceramic oxide layers, silicon containing coatings, silicon carbon containing coatings, silicon nitrogen containing coatings and/or silicon nitrogen carbon containing coatings.

In a dual layer system, the second passivation layer may comprise silicon containing coatings, silicon carbon-containing coatings, silicon nitrogen-containing coatings, silicon carbon nitrogen containing coatings or an additional silicon dioxide and ceramic oxide coating. In a triple layer system, the second passivation layer may comprise silicon carbon-containing coatings, silicon nitrogen-containing coatings, silicon carbon nitrogen containing coatings or an additional silicon dioxide and ceramic oxide coating and the third barrier coating may comprise silicon coatings, silicon carbon-containing coatings, silicon nitrogen-containing coatings, and silicon carbon nitrogen containing coatings.

The silicon containing coating described above is applied by a method selected from the group consisting of (a) chemical vapor deposition of a silane, halosliana, halodisilane, halopolysilane or mixtures thereof, (b) plasma enhanced chemical vapor deposition of a silane, halosilane, halodisilane, halopolysilane or mixtures thereof, or (c) metal assisted chemical vapor deposition of a silane, haslosliana, halodisilane, halopolysilane or mixtures thereof. The silicon carbon coating is applied by a means selected from the group consisting of (1) chemical vapor deposition of a silane, alkylsilane, halosilane, halodisilane, halopolysilane or mixtures thereof in the presence of an alkane of one to six carbon atoms or an alkylsilane, (2) plasma enhanced chemical vapor deposition of a silane, alkylsilane, halosilane, halodisilane, halopolysilane or mixtures thereof in the presence of an alkane of one to six carbon atoms or an alkylsilane or (3) plasma enhanced chemical vapor deposition of a silacyclobutane or disilacyclobutane. The silicon nitrogen-containing coating is deposited by a means selected from the group consisting of (A) chemical vapor deposition of a silane, halosilane, halodisilane, halopolysilane or mixtures thereof in the presence of ammonia, (B) plasma enhanced chemical vapor deposition of a silane, halosilane, halodisilane, halopolysilane, or mixtures thereof in the presence of ammonia or (C) ceramification of a silicon and nitrogen containing preceramic polymer. The silicon carbon nitrogen-containing coating is deposited by a means selected from the group consisting of (i) chemical vapor deposition of hexamethyldisilazane, (ii) plasma enhanced chemical vapor deposition of hexamethyldisilazane, (iii) chemical vapor deposition of silane, alkylsilane, halosilane, halodisilane, halopolysilane or mixture thereof in the presence of an alkane of one to six carbon atoms or an alkylsilane and further in the presence of ammonia, (iv) plasma enhanced chemical vapor deposition of a silane, alkylsilane, haslosliana, halodisilane, halopolysilane or mixture thereof in the presence of an alkane of one to six carbon atoms or an alkylsilane and further in the presence of ammonia and (v) ceramification of a preceramic solution comprising a carbon substituted polysilazane, polysilacyclobutasilazane or polycarbosilane in the presence of ammonia. The silicon dioxide and ceramic oxide coating is applied by the ceramification of a preceramic mixture comprising a silicon dioxide precursor and a ceramic oxide precursor as in the initial coating.

Coatings produced by the instant invention possess low defect density and are useful on electronic devices as protective coatings, as corrosion resistant and abrasion resistant coatings, as temperature and moisture resistant coatings, as dielectric layers and as a diffusion barrier against ionic impurities such as sodium and chloride.

The following non-limiting examples are included so that one skilled in the art may more readily understand the invention.

Infrared analyses were run on the silicon wafers (IR transparent) coated in the following examples. The conversion to ceramic material is indicated by the removal of the organic hydrolyzable groups as well as the hydroxy substituents. The removal of hydroxy groups was evidenced by the disappearance of the peak at about 920 cm$^{-1}$ and the removal of methoxy and ethoxy substituents was evidenced by the disappearance of the peaks at about 1100 cm$^{-1}$ and about 1075-1100 cm$^{-1}$ respectively. The removal of organic substitution (including the hydrolyzable groups not listed above) was evidenced by the disappearance of peaks greater than 1062 cm$^{-1}$.

EXAMPLE 1

A mixture of 0.313 g of Si(OCH$_2$CH$_3$)$_4$ (tetraethyl ortho silicate (TEOS)) and 0.040 g of Zr(O$_2$C$_5$H$_7$)$_4$ (zirconium tetra 2,4-pentanedionate) was dissolved in 9.648 g of ethanol and refluxed for 24 hours. The solution was cooled to room temperature and 0.114 g of water and 0.15 g of 2.5% aqueous HCl was added. This solution was warmed to 60°-70° C. for 30 minutes to form a clear hydrolyzed preceramic mixture. 7 drops of this mixture were flow coated onto a 1 inch square silicon wafer and the solvent allowed to evaporate to form a preceramic coating. The coating was ceramified in 2 stages: In the first stage the wafer was heated at 200° C. for 2 hours in a 2 inch Lindburg furnace containing about 0.04 weight percent flowing ozone (generated by a BHK Inc. Analamp of wavelength 185-579 nM) and water vapor; In the second stage the wafer was heated in ozone (as above) at 200° C. for an additional hour but the water vapor discontinued. A ceramic coating approximately 1500 Å thick was thereby produced. FTIR spectra confirmed removal of essentially all of the alkoxy and most of the hydroxy substituents.

EXAMPLE 2

A mixture of 8.03 g of Si(OCH$_2$CH$_3$)$_4$, 6.78 g of ethanol, 2.8 g of water and 0.02 g of 5% aqueous HCl was heated at 60°-70° C. for 30 minutes and then diluted with 47.3 g of ethanol. 1.8 g of this mixture was mixed with 5.2 g of ethanol and 0.068 g of Ti(OBu)$_2$.(O$_2$C$_5$H$_7$)$_2$ (titanium (dibutoxy) bis (2,4-pentanedionate)) to form a clear hydrolyzed preceramic mixture. 7 drops of the hydrolyzed preceramic mixture was flow coated onto a 1 inch square silicon wafer. The mixture was allowed to dry to form a preceramic coating. The preceramic coating was ceramified in the same manner as Example 1. A ceramic coating approximately 1500 Å thick was thereby produced. FTIR spectra confirmed removal of all of the alkoxy and most of the hydroxy substituents.

EXAMPLE 3

A mixture of 4.7 g of Si(OCH$_2$CH$_3$)$_4$, 3.98 g of ethanol, 9.92 g of water and 3 drops of 5% aqueous HCl was heated at 60°-70° C. for 30 minutes and then diluted with 47.34 g of ethanol. 10 g of this mixture was mixed with 26.2 g of ethanol and 0.235 g of Al(O$_2$C$_5$H$_7$)$_3$ (aluminum tris 2,4-pentanedionate) to form a clear hydrolyzed preceramic mixture. 7 drops of the hydrolyzed preceramic mixture was flow coated onto a 1 inch square silicon wafer. The mixture was allowed to dry to form a preceramic coating. The preceramic coating was ceramified in the same manner as Example 1 to form a ceramic coating approximately 1500 Å thick. FTIR spectra confirmed removal of all of the alkoxy and most of the hydroxy substituents.

EXAMPLE 4

A mixture of 0.729 g of Si(OCH$_2$CH$_3$)$_4$, 0.119 g of Zr(O$_2$C$_5$H$_7$)$_4$, 0.180 g of Al(O$_2$C$_5$H$_7$)$_3$, 0.098 g of Ti(OBu)$_2$(O$_2$C$_5$H$_7$)$_2$ and 28.9 g of ethanol was refluxed for 24 hours. The solution was cooled to room temperature and 0.12 g of water and 1 drop of 5% aqueous HCl was added. This solution was warmed to 60°-70° C. for 30 minutes to form a clear hydrolyzed preceramic mixture. 7 drops of the hydrolyzed preceramic mixture was flow coated onto a 1 inch square silicon wafer. The mixture was allowed to dry to form a preceramic coating. The preceramic coating was ceramified in the same manner as Example 1 to form a ceramic coating approximately 1500 Å thick. FTIR spectra confirmed removal of all of the alkoxy and most of the hydroxy substituents.

EXAMPLE 5

A mixture of 4.7 g of Si(OCH$_2$CH$_3$)$_4$, 3.98 g of ethanol, 9.92 g of water and 3 drops of 5% aqueous HCl was heated at 60°-70° C. for 30 minutes and then diluted with 47.34 g of ethanol. 3 g of this mixture was mixed with 7 g of ethanol to form a clear hydrolyzed preceramic mixture. 7 drops of the hydrolyzed preceramic mixture was flow coated onto a 1 inch square silicon wafer. The mixture was allowed to dry to form a preceramic coating. The preceramic coating was ceramified in the same manner as Example 1 to form a ceramic coating approximately 1500 Å thick. FTIR spectra confirmed SiO$_2$ formation and the removal of all of the alkoxy and most of the hydroxy substituents.

EXAMPLES 6-10

For comparison, preceramic coatings were applied to 1 inch square silicon wafers in the same manner as Examples 1-5. The preceramic coatings were ceramified by heating in 2 stages: In the first stage the wafer was heated at 214° C. for 2 hours in a 2 inch Lindburg furnace containing water vapor (no ozone); In the second stage the wafer was heated for an additional hour at 216° C. (as above) but the water vapor discontinued. The FTIR spectra clearly indicated the presence of more residual hydroxy and alkoxy substituents in these coatings than was observed in the coatings formed in Examples 1-5 when ozone was utilized.

EXAMPLE 11

A mixture of 3.75 g of CH$_2$=CHSi(OCH$_3$)$_3$, 1.37 g of water, 2 drops of aqueous 5% HCl, 11.57 g of isopropyl alcohol (IPA), 2.0 g of butyl alcohol and 2.0 g of Dowanol EB (monobutyl ether of ethylene glycol) was heated at 60°-70° C. for 2 hours. A 1 inch square indium tin oxide coated quartz wafer and a 1 inch square silicon wafer were coated with the solution and then spun at 3000 RPM for 35 seconds to deposit a preceramic coating. The preceramic coating was then ceramified by placing the coated wafer in a 12 inch circular domed stainless steel reactor, flowing 3.1 weight percent ozone generated by an ozone generator (manufactured by PCI) over the wafer, raising the temperature to 215° C. and maintaining it for 2.5 hours. A clear coating was thereby produced on each wafer. FTIR spectra of the coated silicon wafer showed conversion to $SiO_2$ with essentially no vinyl substituents remaining.

EXAMPLE 12

A mixture of 4.5 g of $CH_3Si(OCH_3)_3$, 2.5 g of water, 0.4 g of acetic acid, and 4.0 g of IPA was heated at 60°-74° C. for 30 minutes. The resultant solution was then diluted to 10% solids with IPA. A 1 inch square silicon wafer was coated with the solution and then spun at 3000 RPM for 35 seconds to deposit a preceramic coating. The preceramic coating was then ceramified by placing the coated wafer in a 12 inch circular domed stainless steel reactor, flowing 3.1 weight percent ozone generated by an ozone generator over the wafer, raising the temperature to 215° C. and maintaining it for 2.5 hours. A clear coating was thereby produced. FTIR spectra showed conversion to $SiO_2$ with essentially no methyl and only small amounts of hydroxyl substituents remaining.

EXAMPLE 13

A mixture of 4.5 g of $C_6H_5Si(OCH_3)_3$, 2.5 g of water, 0.4 g of acetic acid, and 4.0 g of IPA was heated at 60°-74° C. for 30 minutes. The resultant solution was then diluted to 10% solids with IPA. A 1 inch square silicon wafer was coated with the solution and spun at 3000 RPM for 35 seconds to deposit a preceramic coating. The preceramic coating was then ceramified by placing the coated wafer in a 12 inch circular domed stainless steel reactor, flowing 3.1 weight percent ozone generated by an ozone generator over the wafer, raising the temperature to 215° C. and maintaining it for 2.5 hours. A clear coating was thereby produced. FTIR spectra showed conversion to $SiO_2$ with essentially no phenyl and only small amounts of hydroxyl substituents remaining.

EXAMPLE 14

A mixture of 1.562 g of $Si(OCH_2CH_3)_4$, 2.92 g of IPA, 0.417 g of water and 2 drops of 5% aqueous HCl was heated at 60°-75° C. for 50 minutes. To this mixture was mixed with 0.25 g of t-butanol and 0.133 g of $VO(OCH_2CH_2CH_3)_3$ to form a clear hydrolyzed preceramic mixture. A 1 inch square silicon wafer was coated with the preceramic mixture and spun at 3000 rpm for 35 seconds. The coated substrate was ceramified by placing it in a 12 inch circular domed stainless steel reactor with 3.1 weight percent flowing ozone, raising the temperature to 200° C. and maintaining it for 5 hours. A clear coating approximately 2524 Å thick was thereby produced on the wafer. FTIR spectra showed removal of all of the alkoxy and most of the hydroxy substituents.

What is claimed is:

1. A method of forming a ceramic or ceramic-like coating on a substrate consisting essentially of:
   coating said substrate with a solution comprising a solvent and one or more hydrolyzed or partially hydrolyzed preceramic silicon alkoxides of the formula $R_xSi(OR)_{4-x}$, wherein R is an alkyl of 1-20 carbon atoms, an aryl, an alkenyl or an alkynyl and x is 0-2;
   evaporating said solvent to thereby deposit a preceramic coating on said substrate; and
   ceramifying said preceramic coating by heating the coated substrate to a temperature of between about 40° to about 400° C. in the presence of ozone.

2. The method of claim 1 further comprising applying a passivating coating to said ceramic or ceramic-like coating, said passivating coating selected from the group consisting of (i) silicon containing coatings, (ii) silicon carbon-containing coatings, (iii) silicon nitrogen-containing coatings, (iv) silicon carbon nitrogen containing coatings and (v) an additional silicon dioxide and ceramic oxide coating, wherein the silicon coating is applied onto the ceramic or ceramic-like coating by a means selected from the group consisting of (a) chemical vapor deposition of a silane, halosilane, halodisilane, halopolysilane or mixtures thereof, (b) plasma enhanced chemical vapor deposition of a silane, halosilane, halodisilane, halopolysilane or mixtures thereof, or (c) metal assisted chemical vapor deposition of a silane, halosilane, halodisilane, halopolysilane or mixtures thereof; and wherein the silicon carbon coating is applied by a means selected from the group consisting of (1) chemical vapor deposition of a silane, alkylsilane, halosliana, halodisilane, halopolysilane or mixtures thereof in the presence of an alkane of one to six carbon atoms or an alkylsilane, (2) plasma enhanced chemical vapor deposition of a silane, alkylsilane, halosilane, halodisilane, halopolysilane or mixtures thereof in the presence of an alkane of one to six carbon atoms or an alkylsilane or (3) plasma enhanced chemical vapor deposition of a silacyclobutane or disilacyclobutane; and wherein the silicon nitrogen-containing coating is deposited by a means selected from-the group consisting of (A) chemical vapor deposition of a silane, halosilane, halodisilane, halopolysilane or mixtures thereof in the presence of ammonia, (B) plasma enhanced chemical vapor deposition of a silane, halosilane, halodisilane, halopolysilane, or mixtures thereof in the presence of ammonia or (C) ceramification of a silicon and nitrogen containing preceramic polymer, and wherein the silicon carbon nitrogen-containing coating is deposited by a means selected from the group consisting of (i) chemical vapor deposition of hexamethyldisilazane, (ii) plasma enhanced chemical vapor deposition of hexamethyldisilazane, (iii) chemical vapor deposition of silane, alkylsilane, halosliana, halodisilane, halopolysilane or mixture thereof in the presence of an alkane of one to six carbon atoms or an alkylsilane and further in the presence of ammonia, (iv) plasma enhanced chemical vapor deposition of a silane, alkylsilane, halosilane, halodisilane, halopolysilane or mixture thereof in the presence of an alkane of one to six carbon atoms or an alkylsilane and further in the presence of ammonia and (v) ceramification of a preceramic solution comprising a carbon substituted polysilazane, polysilacyclobutasilazane or polycarbosilane in the presence of ammonia; and wherein the silicon dioxide and ceramic oxide coating is applied by ceramification of a preceramic mixture comprising a silicon dioxide precursor and a ceramic oxide precursor, to produce the silicon-containing passivating coating, whereby a dual layer, ceramic or ceramic-like, coating is obtained on the substrate.

3. The method of claim 1 further comprising applying a passivating coating to said ceramic or ceramic-like coating, said passivating coating selected from the group consisting of (i) silicon carbon-containing coatings, (ii) silicon nitrogen-containing coatings, (iii) silicon carbon nitrogen containing coatings and (iv) an additional silicon dioxide and ceramic oxide coating, wherein the silicon carbon coating is applied by a means selected from the group consisting of (1) chemical vapor deposition of a silane, alkylsilane, halosilane, halodisilane, halopolysilane or mixtures thereof in the presence of an alkane of one to six carbon atoms or an alkylsilane, (2) plasma enhanced chemical vapor deposition of a silane, alkylsilane, halosilane, halodisilane, halopolysilane or mixtures thereof in the presence of an alkane of one to six carbon atoms or an alkylsilane or (3) plasma enhanced chemical vapor deposition of a silacyclobutane or a disilacyclobutane; and wherein the silicon nitrogen-containing coating is deposited by a means selected from the group consisting of (A) chemical vapor deposition of a silane, halosilane, halodisilane, halopolysilane or mixtures thereof in the presence of ammonia, (B) plasma enhanced chemical vapor deposition of a silane, halosilane, halodisilane, halopolysilane, or mixtures thereof in the presence of ammonia or (C) ceramification of a silicon and nitrogen containing preceramic polymer, and wherein the silicon carbon nitrogen-containing coating is deposited by a means selected from the group consisting of (i) chemical vapor deposition of hexamethyldisilazane, (ii) plasma enhanced chemical vapor deposition of hexamethyldisilazane, (iii) chemical vapor deposition of silane, alkylsilane, halosilane, halodisilane, halopolysilane or mixture thereof in the presence of an alkane of one to six carbon atoms or an alkylsilane and further in the presence of ammonia, (iv) plasma enhanced chemical vapor deposition of a silane, alkylsilane, halosilane, halodisilane, halopolysilane or mixture thereof in the presence of an alkane of one to six carbon atoms or an alkylsilane and further in the presence of ammonia, and (v) ceramification of a preceramic solution comprising a carbon substituted polysilazane, polysilacyclobutasilazane or polycarbosilane in the presence of ammonia, and wherein the silicon dioxide and ceramic oxide coating is applied by ceramification of a preceramic mixture comprising a silicon dioxide precursor and a ceramic oxide precursor, to produce the passivating coating; and further comprising applying an additional silicon containing barrier coating to said passivating coating, said silicon containing barrier coating selected from the group consisting of (i) silicon coatings, (ii) silicon carbon-containing coatings, (iii) silicon nitrogen-containing coatings, and (iv) silicon carbon nitrogen containing coatings, wherein the silicon coating is applied onto the passivating coating by a means selected from the group consisting of (a) chemical vapor deposition of a silane, halosilane, halodisilane, halopolysilane or mixtures thereof, (b) plasma enhanced chemical vapor deposition a silane, halosilane, halodisilane, halopolysilane or mixtures thereof, or (c) metal assisted chemical vapor deposition of a silane, halosilane, halodisilane, halopolysilane or mixtures thereof; and wherein the silicon carbon containing coating is applied by a means selected from the group consisting of (1) chemical vapor deposition of a silane, alkylsilane, halosilane, halodisilane, halopolysilane or mixtures thereof in the presence of an alkane of one to six carbon atoms or an alkylsilane, (2) plasma enhanced chemical vapor deposition of a silane, alkylsilane, halosilane, halodisilane, halopolysilane or mixtures thereof in the presence of an alkane of one to six carbon atoms or an alkylsilane or (3) plasma enhanced chemical vapor deposition of a silacyclobutane or a disilacyclobutane; and wherein the silicon nitrogen-containing coating is deposited by a means selected from the group consisting of (A) chemical vapor deposition of a silane, halosilane, halodisilane, halopolysilane or mixtures thereof in the presence of ammonia, (B) plasma enhanced chemical vapor deposition of a silane, halosilane, halodisilane, halopolysilane, or mixtures thereof in the presence of ammonia, or (C) ceramification of a silicon and nitrogen-containing preceramic polymer and wherein the silicon carbon nitrogen-containing coating is deposited by a means selected from the group consisting of (i) chemical vapor deposition of hexamethyldisilazane, (ii) plasma enhanced chemical vapor deposition of hexamethyldisilazane, (iii) chemical vapor deposition of silane, alkylsilane, halosilane, halodisilane, halopolysilane or mixture thereof in the presence of an alkane of one to six carbon atoms or an alkylsilane and further in the presence of ammonia, (iv) plasma enhanced chemical vapor deposition of a silane, alkylsilane, halosilane, halodisilane, halopolysilane or mixture thereof in the presence of an alkane of one to six carbon atoms or an alkylsilane and further in the presence of ammonia and (v) ceramification of a preceramic solution comprising a carbon substituted polysilazane, polysilacyclobutasilazane or polycarbosilane in the presence of ammonia, to produce the silicon-containing barrier coating, whereby a multilayer, ceramic or ceramic-like, coating is obtained on said substrate.

4. The method of claim 1 wherein said silicon alkoxide is of the formula $Si(OR)_4$ and R is an alkyl of 1–4 carbon atoms.

5. The method of claim 2 wherein said silicon alkoxide is of the formula $Si(OR)_4$ and R is an alkyl of 1–4 carbon atoms.

6. The method of claim 3 wherein said silicon alkoxide is of the formula $Si(OR)_4$ and R is an alkyl of 1–4 carbon atoms.

7. The method of claim 1 wherein said silicon alkoxide is of the formula $R_xSi(OR)_{4-x}$, wherein R is an alkyl of 1–4 carbon atoms, an aryl, an alkenyl or an alkynyl and x is 1.

8. The method of claim 2 wherein said silicon alkoxide is of the formula $R_xSi(OR)_{4-x}$, wherein R is an alkyl of 1–4 carbon atoms, an aryl, an alkenyl or an alkynyl and x is 1.

9. The method of claim 3 wherein said silicon alkoxide is of the formula $R_xSi(OR)_{4-x}$, wherein R is an alkyl of 1–4 carbon atoms, an aryl, an alkenyl or an alkynyl and x is 1.

10. The method of claim 1 wherein said substrate is an electronic device.

11. The method of claim 2 wherein said substrate is an electronic device.

12. The method of claim 3 wherein said substrate is an electronic device.

13. The method of claim 4 wherein said substrate is an electronic device.

14. The method of claim 7 wherein said substrate is an electronic device.

15. The method of claim 1 wherein a ceramic oxide precursor is additionally present in said solution.

16. The method of claim 15 wherein said ceramic oxide precursor is a composition comprising an element selected from the group consisting of titanium, zirconium, aluminum, tantalum, vanadium, niobium, boron and phosphorous with at least one hydrolyzable substituent.

17. The method of claim 16 wherein the hydrolyzable substituent is selected from the group consisting of alkoxy or acyloxy.

18. The method of claim 2 wherein a ceramic oxide precursor is additionally present in said solution, said ceramic oxide precursor comprising an element selected from the group consisting of titanium, zirconium, aluminum, tantalum, vanadium, niobium, boron and phosphorous with at least one hydrolyzable substituent.

19. The method of claim 18 wherein said hydrolyzable substituent is selected from the group consisting of alkoxy or acyloxy.

20. The method of claim 3 wherein a ceramic oxide precursor is additionally present in said solution, said ceramic oxide precursor comprising an element selected from the group consisting of titanium, zirconium, aluminum, tantalum, vanadium, niobium, boron and phosphorous with at least one hydrolyzable substituent.

21. The method of claim 20 wherein said hydrolyzable substituent is selected from the group consisting of alkoxy or acyloxy.

22. The method of claim 4 wherein a ceramic oxide precursor is additionally present in said solution, said ceramic oxide precursor comprising an element selected from the group consisting of titanium, zirconium, aluminum, tantalum, vanadium, niobium, boron and phosphorous with at least one hydrolyzable substituent.

23. The method of claim 22 wherein said hydrolyzable substituent is selected from the group consisting of alkoxy or acyloxy.

24. The method of claim 7 wherein a ceramic oxide precursor is additionally present in said solution, said ceramic oxide precursor comprising an element selected from the group consisting of titanium, zirconium, aluminum, tantalum, vanadium, niobium, boron and phosphorous with at least one hydrolyzable substituent.

25. The method of claim 24 wherein said hydrolyzable substituent is selected from the group consisting of alkoxy or acyloxy.

26. The method of claim 1 wherein said solution is coated onto said substrate by spray coating, dip coating, flow coating or spin coating.

27. The method of claim 1 wherein said ceramification is also carried out in the presence of water vapor.

28. The method of claim 1 wherein said ceramification is carried out at a temperature of about 200° C.

29. The method of claim 1 wherein said ozone is present in the range of from about 0.01 to about 10 weight percent.

30. The method of claim 1 wherein said ozone is generated by a source of UV light.

31. The method of claim 1 wherein said ozone is generated by an ozone generator.

32. The method of claim 1 wherein the substrate is an indium tin oxide containing electronic device.

33. The method of claim 2 wherein the substrate is an indium tin oxide containing electronic device.

34. The method of claim 3 wherein the substrate is an indium tin oxide containing electronic device.

35. The article produced by the process of claim 32.

36. The article produced by the process of claim 33.

37. The article produced by the process of claim 34.

* * * * *